(12) United States Patent
Allenson et al.

(10) Patent No.: US 6,829,278 B1
(45) Date of Patent: Dec. 7, 2004

(54) LIGHT EMITTING DEVICE AND TRANSISTOR

(75) Inventors: Michael B Allenson, Malvern (GB); Stephen G Ayling, Malvern (GB); David R Wight, Malvern (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/445,991

(22) PCT Filed: Jun. 17, 1998

(86) PCT No.: PCT/GB98/01775

§ 371 (c)(1),
(2), (4) Date: Dec. 17, 1999

(87) PCT Pub. No.: WO99/00881

PCT Pub. Date: Jan. 7, 1999

(30) Foreign Application Priority Data

Jun. 25, 1997 (GB) .............................. 9713365

(51) Int. Cl.[7] .............................................. H01S 5/00
(52) U.S. Cl. .............................. 372/50; 372/25; 372/43
(58) Field of Search .............................. 372/25, 43, 50, 372/23

(56) References Cited

U.S. PATENT DOCUMENTS

| | | | |
|---|---|---|---|
| 4,212,023 A | | 7/1980 | Chu et al. |
| 4,278,515 A | | 7/1981 | Pearlstein et al. |
| 4,644,587 A | | 2/1987 | Takahashi et al. |
| 4,928,285 A | * | 5/1990 | Kushibe ...................... 372/45 |
| 5,130,531 A | * | 7/1992 | Ito .............................. 250/216 |
| 5,278,515 A | | 1/1994 | Mathews |
| 5,317,440 A | * | 5/1994 | Hsu ............................ 359/113 |
| 5,440,577 A | * | 8/1995 | Tucker ........................ 372/50 |
| 5,799,029 A | * | 8/1998 | Rossi et al. .................... 372/50 |

FOREIGN PATENT DOCUMENTS

| | | |
|---|---|---|
| WO | WO 92 15136 | 9/1992 |
| WO | WO 95 07565 A | 3/1995 |
| WO | WO 96 08857 A | 3/1996 |

OTHER PUBLICATIONS

Patent Abstracts of Japan, vol. 009, No. 015, Jan. 22, 1985 & JP 59 163927 A, Sep. 17, 1984.
Patent Abstracts of Japan, vol. 011, No. 382, Dec. 12, 1987 & JP 62 146024 A, Jun. 30, 1987.
Patent Abstracts of Japan, vol. 014, No. 564, Dec. 14, 1990 & JP 02 244834 A, Sep. 28, 1990.
D.R. Wright et al, "Optically coupled transistors and the achievement of insertion gain in broadband directly modulated optical links", *IEEE Colloquium on Fibre Optics in Microwave Systems and Radio Acces*, Jun. 26, 1997, p. 5/1–5.

* cited by examiner

*Primary Examiner*—Don Wong
*Assistant Examiner*—Cornelius H Jackson
(74) *Attorney, Agent, or Firm*—Nixon & Vanderhye P.C.

(57) ABSTRACT

A light emitting device for generating at least one beam of output radiation from an input current of electrons comprises at least two p-n junction devices for converting the input current of electrons into photons, wherein the p-n junction devices are electrically connected in series such that the input impedance of the light emitting device is substantially equal to the sum of the individual impedance of the p-n junction devices. Hence the quantum efficiency of the light emitting device is substantially equal to the sum of the individual quantum efficiencies of the p-n junction devices. In a preferred embodiment, the light emitting device comprises a plurality of p-n junction devices connected in series such that the input impedance of the light emitting device is equal to 50 Ω without the need for additional circuitry or impedance matching elements. The device may therefore have a 50 Ω impedance over a broad frequency band, limited by the modulation frequency limit of the individual p-n junctions. Typically, the p-n junctions may be AlGaAs, AlGaInP, AlGaInAs or AlGaInAsp laser diode devices. The invention also relates to an optically coupled bipolar transistor device.

17 Claims, 6 Drawing Sheets

LIGHT EMITTING DEVICE AND TRANSISTOR

This application is the US national phase of international application PCT/GB98/01775, filed in English on 17 Jun. 1988, which designated the US. PCT/GB98/01775 claims priority to GB Application No. 9713365.6 filed 25 Jun. 1997. The entire contents of these applications are incorporated herein by reference.

BACKGROUND OF THE INVENTION

1. Field of the Invention

The invention relates to a laser device capable of operating with enhanced quantum efficiency across a broadband of modulation frequencies. In particular, this may be achieved in the fixed impedance (50 Ω) microwave circuitry without the need for complex impedance matching. The invention also relates to a transistor-like device capable of delivering current gain across a broadband of frequencies, again without the need for complex impedance matching. The invention has advantages in the field of fibre optic communications and transmissions, and in RF applications due to its broadband nature and the ability to produce current gain.

2. Discussion of Prior Art

The operation of a conventional common base bipolar transistor is well know in the prior art, for example see W. Shockley, Bell Syst. Technology, J. 28, 435,1949. The crucial feature of this transistor is the transit of current from the low impedance input (base/emitter) circuit to a high impedance output (base/collector) circuit by means of minority carrier diffusion across a thin (base) semiconductor layer. The reverse biased collector output can therefore deliver current into a relatively high impedance load resistor.

It has been proposed to use a Beam Of Light Transistor (BOLT) [R. Rediker el al., Proc. IEEE 51, 218 1963] in which the transfer of current is achieved by converting the minority carriers into photons before transit across a "base" layer in the device and then converting the photons back to a current at the output. However, the optical transfer cannot be achieved efficiently in such devices and current losses are always encountered and therefore current gain cannot be achieved.

In conventional microwave technology, to increase microwave power at high frequencies several individual transistors may be connected in parallel in order to achieve current gain. Such small devices have a high speed of operation, but the resistance of the parallel arrangement is small. In microwave circuitry, where the majority of microwave generation, transmission, reception and cable hardware is of 50 Ω impedance, it is to difficult to match the low impedance of these devices to the 50 Ω hardware over a broad frequency range. As conventional electronic transistors are three terminal devices, they may only be combined in parallel. This restricts the possibilities for thermal management.

Another problem associated with electrical transistors is that the displacement currents produced limit the speed of operation of the transistor. Furthermore, as the input circuit and the output circuit are coupled problems can arise due to feedback from the output circuit to the input circuit.

The transistor of the present invention overcomes the problems in known electronic and optical transistor devices. Furthermore, its characteristics and design make it suitable for application to fibre optic communications and the optical distribution of radiofrequency, microwave, mm-wave and digital signals in electronic systems such as phased array radars. In the field of fibre optic links, conventional semiconductor lasers are commonly used. The current technology for achieving directly modulated, broadband, high speed fibre optic links has been developed principally for digital communications systems. Typically, such fibre optic links operate at an upper frequency limit of around 10 GHz set by the response capability of the laser to the input signal. Conventional broadband fibre optic links, however, cannot deliver signal gain unless either electronic or optical amplifiers are included in the signal path. Furthermore, for use in fixed impedance environments, such as microwave circuits, a relatively narrow band impedance transformation is need to match the low impedance laser in order to minimise signal loss.

The invention overcomes the narrow bandwidth limitation associated with conventional lasers in that no impedance transformation is necessary. The laser may also be used in a transistor device to provide current gain across a broadband of modulation frequencies, from DC up to typically 30 GHz. For the purpose of this description, references to frequency shall be taken to mean modulation frequency rather than the optical emission frequency of the laser. Such a device therefore overcomes the impedance transformation problems encountered when conventional transistors are used in 50 Ω microwave circuitry. The laser is also capable of providing both AC and DC signal gain in combination with a photodiode, which conventional lasers cannot deliver.

SUMMARY OF THE INVENTION

According to one aspect of the invention, a light emitting device, having an input impedance and a device quantum efficiency, for generating at least one beam of output radiation from an input current of electrons comprises;

at least two light emitting means, each having an impedance and an individual quantum efficiency, for converting the input current of electrons into a beam of output radiation, characterised in that the light emitting means are electrically connected such that the device quantum efficiency is greater than or equal to the individual quantum efficiency of one of the light emitting means.

In one embodiment of the invention, the light emitting means are electrically connected in series such that the input impedance of the light emitting device is substantially equal to the sum of the impedances of the light emitting means and the device quantum efficiency may be substantially equal to the sum of the quantum efficiencies of the light emitting means.

In a preferred embodiment, the light emitting means may be electrically connected such that the input impedance of the light emitting device is substantially equal to 50 Ω without additional circuitry or impedance matching elements.

In a preferred embodiment, the light emitting means may be electrically connected such that the input impedance of the light emitting device is substantially equal to 50 Ω without additional circuitry or impedance matching elements.

The light emitting means, having a modulation frequency limit, wherein the input impedance of the light emitting device is substantially equal to 50 Ω across a frequency range substantially from DC to the modulation frequency limit of each of the light emitting means.

The light emitting means may be p-n junctions, for example laser diodes or light emitting diodes. Typically, the laser diode devices maybe any one of AlGaAs, AlGaInP, AlGaInAs or AlGaInAsP laser diode devices. The p-n junctions may have an end face coated with a reflective coating.

According to another aspect of the invention, an optically coupled transistor for generating an output electrical signal comprises;

the light emitting device as herein described for emitting at least two beams of output radiation and at least one photodetector for detecting the beams of radiation output from the light emitting device and for converting the beams of output radiation into an output electrical current.

In one embodiment of the optically coupled transistor, the one or more photodetectors may be a photodiode device.

For example, the optically coupled transistor may comprise at least two photodetectors, wherein the photodetectors are connected in any one of a series connection, a parallel connection or a series parallel connection.

The optically coupled transistor may also comprise one or more optical fibres for transmitting the beams of output radiation to the one or more photodetectors.

According to another aspect of the invention, a fibre optic link comprises one or more optical fibres having an input endface and an output endface, and also comprising the light emitting device as herein described, wherein the light emitting device is situated at the input endface of one or more optical fibres such that the beams of radiation output from the light emitting device are input to the one or more optical fibres.

According to another aspect of the invention, a method for distributing an input signal into a plurality of output channels comprises the steps of;

(i) outputting two or more beams of radiation from the light emitting device as herein described comprising at least two light emitting means and (ii) inputting each of the two or more beams of output radiation into one of the output channels, whereby the light emitting means are connected such that the device quantum efficiency is greater than or equal to the individual quantum efficiency of one of the light emitting means.

In a preferred embodiment, the method may comprise the step of inputting each of the two or more beams of output radiation into a different one of the output channels.

According to another aspect of the invention, an optical repeater for receiving an optical input signal and generating one or more optical output signals comprises;

a photodetector for receiving the optical input signal and converting the optical input signal into an electrical signal and the laser device of any of claims for receiving the said electrical signal and outputting one or more optical signals.

In a preferred embodiment, the optical repeater also comprises amplification means for amplifying the electrical signal output from the photodetector.

BRIEF DESCRIPTION OF THE DRAWINGS

The invention will now be described by example only with reference to the following figures in which.

DETAILED DISCUSSION OF EMBODIMENTS

Figure 1:
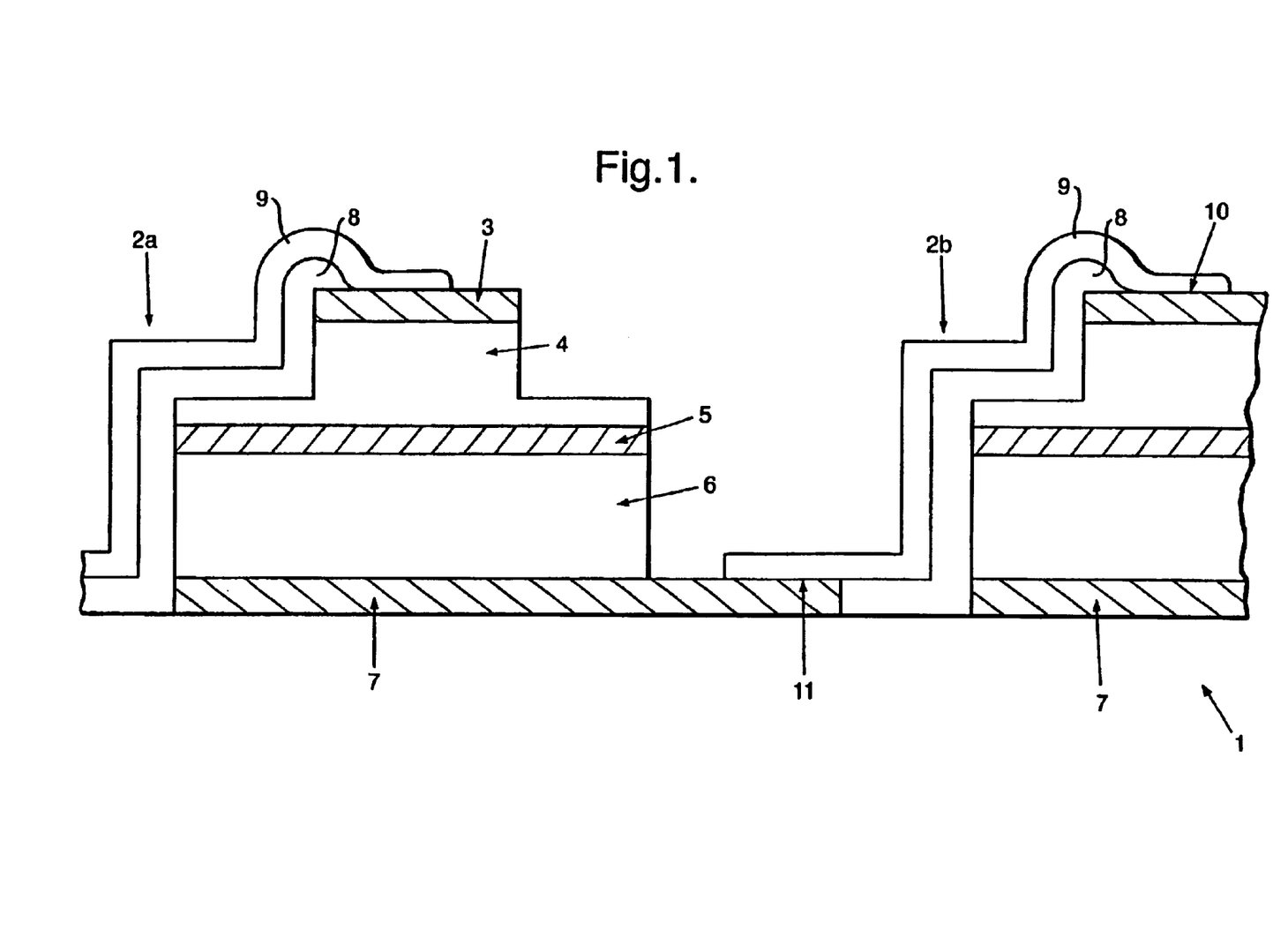
FIG. 1 shows the epitaxial layer structure of the laser device of the present invention.

Referring to FIG. 1, in one example of the invention a laser device 1 may comprise a number of discrete p-i-n laser diode elements 2*a*,2*b* in an array. Only two laser diodes are shown in the figure but in practice a greater number of laser diodes may be included in the device. For example, each individual laser diode 2*a*,2*b* may be a AlGaAs p-i-n laser diode comprising a top layer 3 of highly doped, low resistance p-type GaAs, on a moderately doped upper cladding layer 4. This is formed on a waveguide layer 5 which is undoped, formed on a lower cladding layer 6, wherein the waveguide layer 5 has a lower band gap than either the upper or lower cladding layers 4,6. Embedded within the waveguide layer 5 are two 10 nm GaAs quantum wells (not shown) that provide optical gain. The combination of the upper and lower cladding 4,6 forms a double heterojunction barrier layer confining both photons and carriers to the undoped waveguide layer 5.

Typically, layer 3 may be p-type GaAs (typical thickness 0.1 $\mu$m, typical doping concentration $5\times10^{19}$ cm$^{-3}$), the upper cladding layer 4 may be AlGaAs (40%), (typical thickness 1.5 $\mu$m, typical doping concentration $5\times10^{17}$ cm$^{-3}$) and the lower cladding layer 6 may by n-type AlGaAs (40%) (typical thickness 1.5 $\mu$m, typical doping concentration $5\times10^{-17}$ cm$^{-3}$). The waveguide layer 5 may typically be undoped AlGaAs (20%) (typical thickness 0.23 $\mu$m).

Figure 2:
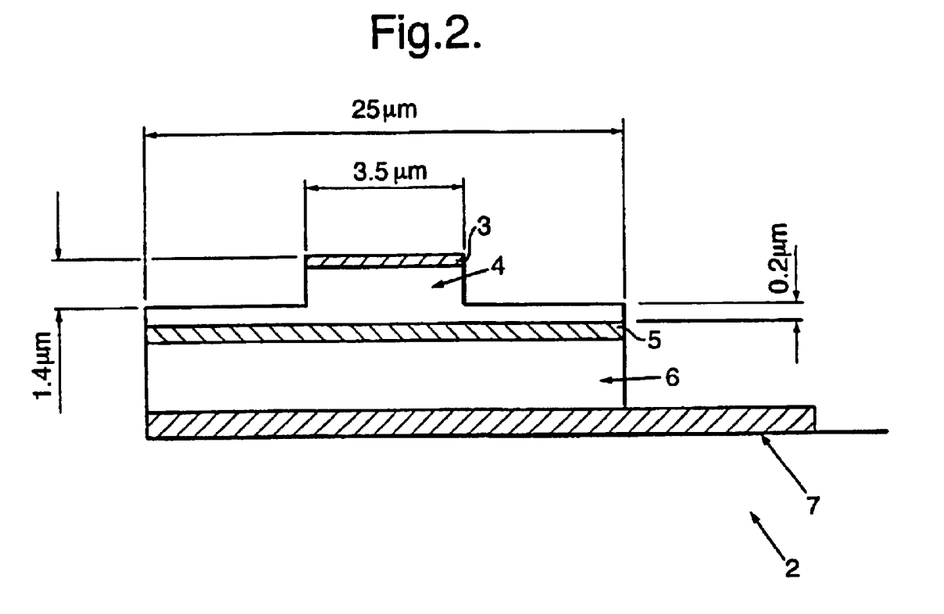
FIG. 2 shows the typical dimensions of the device shown in FIG. 1

The cladding layer 6 of each laser element 2*a*,2*b* is situated on a highly doped n-type layer 7 which forms a low resistance GaAs contact for the laser diode 2*a*,2*b*. Typically, this cladding layer 7 may be a GaAs layer having a thickness of between 0.5 and 1.0 $\mu$m and a doping concentration of $2\times10^{18}$ cm$^{-3}$. The percentage indications refer to the percentage of Al in the layers. Each laser diode 2*a*,2*b* has an insulating layer, for example polyimide, covering the mesa and a plated electrical layer 9 covering that. The p-type layer 3 is in contact with the plated electrical layer 9 at junction 10 and the n-type layer 7 is in contact with the plated electrical layer 9 at junction 11. The laser array 1 may be constructed using integrated photonics technology techniques which would be conventional to one familiar with the art For each laser element 2*a*,2*b* to operate without undue RF noise, optical waveguide operation should be single mode. The typical dimensions of the laser having single mode optical waveguide operation are shown in FIG. 2. In this example, the so-called "ridge" waveguide (i.e. layer 3 and upper region of 4) has a width of 3.5 $\mu$m and will support only one mode when lasing. The ridge is supported on a mesa (layers 5,6 and lower region of 4), typically having a width of 25 $\mu$m. This ridge must be wide enough for the optical mode supported not to be influenced by the edges of the mesa which would otherwise support higher modes also. Typically, layer 7 extends beyond the width of the mesa, on one side only, by around 50 μm. Although single mode lasers are necessary for high frequency operation, due to mode noise, for lower frequencies multi mode lasers or light emitting diodes may be used in the device 1.

As the highly doped n-type layer 7 which forms a low resistance GaAs contact for each individual laser is completely removed on one side of each laser element 2a,2b, this leaves each laser electrically isolated from its neighbour by the semi-insulating GaAs substrate layer 7. The laser diodes 2a,2b are connected in series by means of the metal layer 9.

Figure 3:
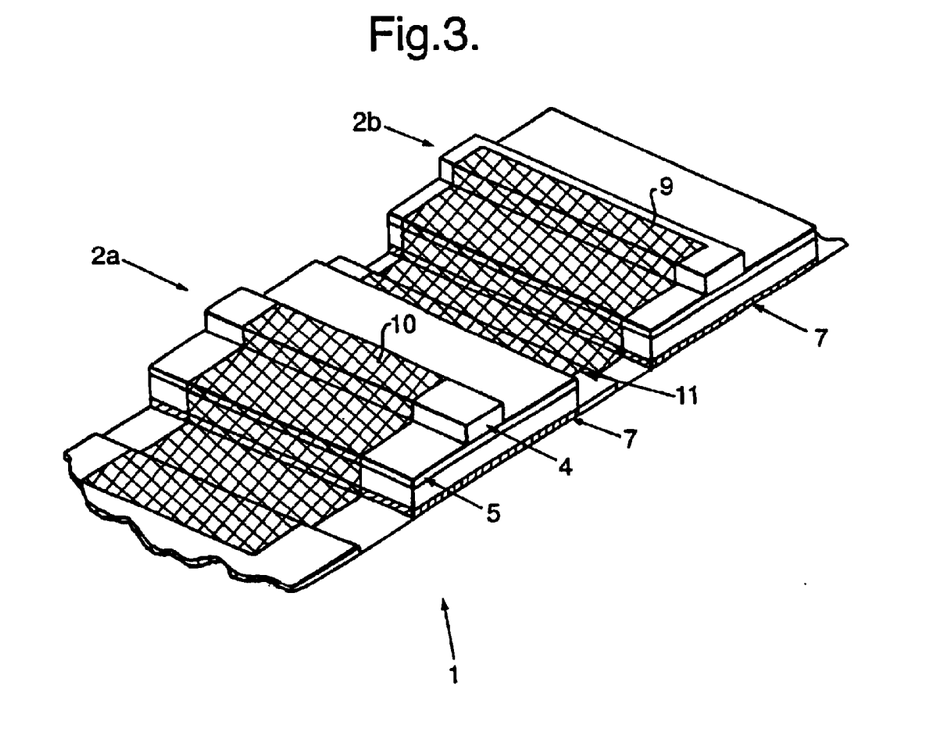
FIG. 3 shows a three-dimensional illustration of the laser device shown in FIG. 1.

Returning to FIG. 1, current, $I_e$, injected through the top layer 3, on the first laser 2a in the series, passes down through the p-i-n junction (layers 4,5 and 6 respectively) emitting light from the quantum wells within the intrinsic region 5. The current then leaves the first laser 2a through the bottom layer 7, and passes over the mesa of the next element in the series by means of the plated electrical layer 9. The current is injected into this next laser element 2b through the top layer 3 and passes down through this p-i-n junction, as before. FIG. 3 shows a three-dimensional view of a section of an array of discrete lasers (two lasers 2a,2b are shown in the figure), where the laser elements 2a,2b are connected in series. The figure also shows the junction 10, a p-type contact, and junction 11, an n-type contact. Each laser shares a contact layer 9 with its neighbour on either side except for the first and last lasers in the array whose unshared contacts act as the input and output contacts for the whole array.

The laser device 1 shown in FIG. 1 is an illustration of an integrated version of the device which would be capable of operating at high speeds. In fact, the elements may be any light emitting p-n junction device. Light Emitting Diodes (LEDs) are also quite suitable. For the purpose of this specification, the term p-n junction should be taken to include any variations of the semiconductor device structure having p-type and n-type components, including p-i-n junctions. Examples of lasers which may be used include AlGaAs, AlGaInAs, AlGaInP and AlGaInAsP devices.

The laser device 1 shown in FIG. 1 is an integrated device which may be constructed on a single chip. An important feature of the integrated device 1 shown in FIG. 1 is that each laser diode 2a,2b is on an insulating substrate with the only electrical connection between them being the plated metal layer 9 connecting the laser diodes 2a,2b in series. However, the invention is not intended to be limited to integrated devices and may also take the form of a series of discrete components connected in series in a circuit An integrated device, however, does have the advantage of a higher speed of operation than a circuit manifestation.

One key functional advantage of the laser device 1 is that the external incremental quantum efficiency of the array is greater than that of a single laser. The external incremental quantum efficiency ($\eta_{LD}$) of a laser is conventionally measured in photons per electron and is a key measure of laser efficiency. For the purpose of this description, the term "quantum efficiency" shall be taken to mean the external incremental quantum efficiency. The net quantum efficiency of the laser device 1 is the sum of all the individual efficiencies of each element. This allows the device to operate with a quantum efficiency of greater than 100%. This has important advantages for the transistor action and in fibre optic signal distribution where this efficiency determines the overall current or signal transfer efficiency.

Figure 4:
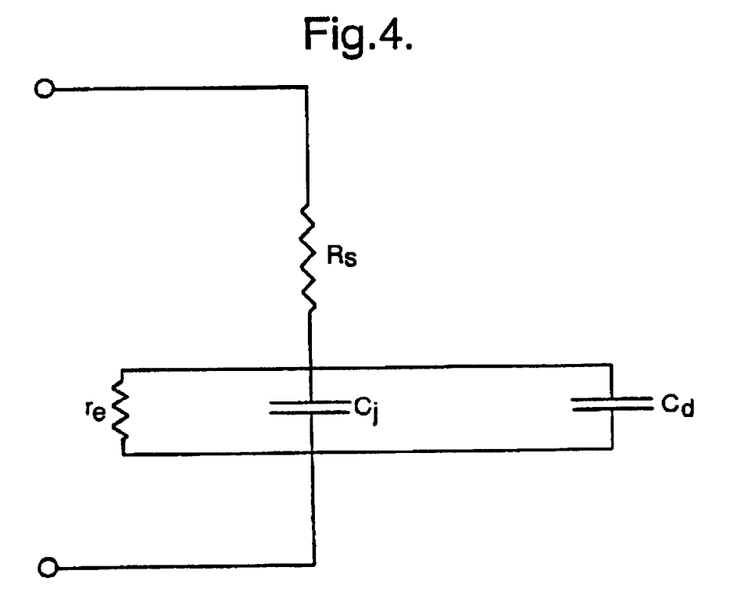
FIG. 4 shows the electrical circuit corresponding to a AlGaAs laser diode which may be used in the invention.

A further advantage of the laser device 1 is that the impedance may easily be matched to the 50 Ω fixed impedance of microwave circuitry, without the need for additional circuitry or matching elements. However, a biasing network is needed so that the light emitting device 1 may be biased above laser threshold current. The details of a suitable biasing network would be conventional to one familiar with the art and are not described in this specification. The impedance characteristic may be understood by considering the input impedance of a single laser diode. For example, FIG. 4 shows an equivalent circuit for a forward biased, one-sided, abrupt p-n junction. The circuit shown is approximately equivalent to a typical AlGaAs laser diode device where $R_S$ represents the parasitic series resistance, $r_c$ represents the dynamic junction resistance, $C_j$ represents the depletion capacitance and $C_d$ represents the diffusion capacitance. The operation of a p-n junction is conventional to one skilled in the art and the terms referred to above and the origin of the quantities defined as such would be understood by such a person.

In a AlGaAs laser diode device, having the equivalent circuit shown in FIG. 4, and at a current density of about $1\times10^4$ A cm$^{-2}$ into a junction area of about $10^{-5}$ cm$^2$, the value of the quantity, $R_S$, is typically 5 Ω. The dynamic junction resistance, $r_c$, is given by;

$$\frac{kT}{qI} = \frac{25 \text{ mV}}{I}$$

where I is the current and q is the electronic charge. A current of 100 mA therefore gives a dynamic junction resistance, $r_c$, of 0.25 Ω. The depletion capacitance, $C_j$ (at a forward bias of $1\times10^4$ A cm$^{-2}$) is typically around 5 pF. The diffusion capacitance, $C_d$, has an impedance in the region of $5\times10^{-3}$ Ω at a frequency of 10 GHz.

The circuit shown in FIG. 4 therefore behaves as if it were a simple 5 Ω resistor at all frequencies below approximately 20 GHz. This resistance, $R_S$, is parasitic and is at least 10 times the value of the dynamic junction resistance, $r_c$. Hence if ten laser elements are included in the laser device 1 shown in FIG. 1, this gives an input impedance of 50 Ω. Furthermore, the device also has a quantum efficiency ten times greater than that of a single device and if the parasitic resistance, $R_S$, can be reduced further (i.e. to less than around 5 Ω) it is possible to achieve still larger quantum efficiencies by including more emitters, whilst retaining the 50 Ω impedance.

In alternative simple series connections to achieve 50 Ω impedance, the lasers can be combined in combinations of series and parallel. For example, if the lasers have a series resistance of 10 Ω, a simple series combination would consist of 5 lasers. As an alternative, two lasers could be connected in parallel, giving an impedance of 5 Ω, with each parallel combination then being connected in series to give a final impedance of 50 Ω.

According to another aspect of the invention, the device may also be combined with a photodetector, such as a conventional semiconductor p-i-n photodiode under reverse bias, to produce a transistor-like device which operates on the basis of the optical transfer of photons rather than the transfer of minority carriers as in conventional transistor devices.

Figure 5:
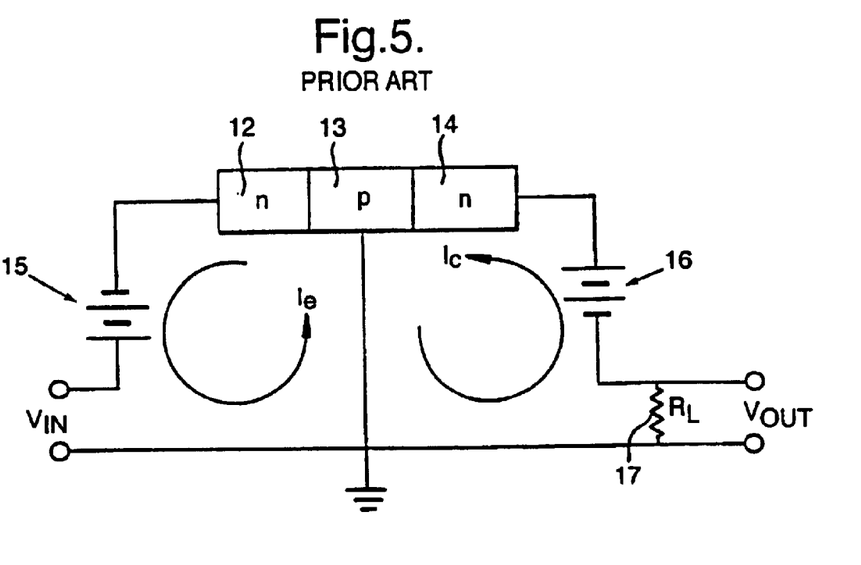
FIG. 5 shows a diagram of a conventional common base electronic transistor, FIGS. 6(*a*) and 6(*b*) show schematic diagrams of an optically coupled transistor (OCT) comprising the laser device shown in FIG. 1.

Referring to FIG. 5, a conventional common base electronic transistor may typically comprise an n-p-n junction, comprising an emitter 12 (n-type region), a base 13 (p-type region) and a collector 14 (n-type region). The input emitter 1 is forward biased by means of an applied voltage 15 and the output of the collector 3 is reverse biased by means of an applied voltage 16. Electrons transit the p-type base layer 13 where a small fraction of the electrons are lost by recombination and produce a small base current $I_b$. The base current is given by $I_b=I_e-I_c$, where $I_e$ and $I_c$ are the currents flowing in the base/emitter input circuit and the base/collector output circuit respectively, as indicated in the figure.

The base/collector "output" circuit also comprises a load resistance 17 ($R_L$) which may have a relatively high impedance. Since the base/emitter "input" circuit is of low (DC and AC) impedance and the output of the reverse biased collector can deliver current into the relatively higher impedance load impedance, $R_L$, the transistor is therefore capable of delivering power gain.

However, for power gain to be delivered by the transistor in 50 Ω impedance circuits, such as for microwave generation, transmission, reception and cable hardware requires current gain. Furthermore, the bipolar transistor shown in FIG. 1, is not capable of delivering any current gain since the collector current is always less than the emitter current because of the small base current.

Figure 6A:
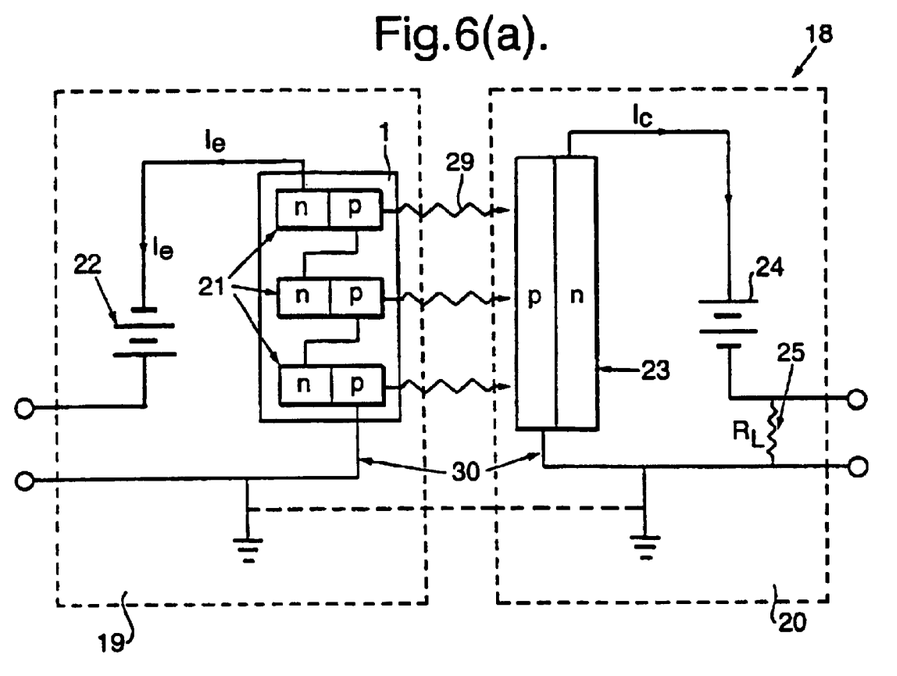

Referring to FIG. 6(a), a second aspect of the invention relates to a transistor 18 capable of delivering current gain, including the laser device shown in FIG. 1. The transistor also includes a photodetector or an array of photodetectors connected in a series, parallel or series parallel arrangement. The transistor shall hereinafter be referred to as an optically couple transistor device, or OCT device. The OCT device may be constructed using integrated-on-chip monolithic photonics technology.

The OCT device 18 comprises an input circuit 19 (the "base/emitter" circuit) and an output circuit 20 (the "base/collector" circuit) which may have a common "base" connection 30. The input circuit 19 comprises the laser device 1 shown in FIG. 1. The laser device 1 in the figure is shown to comprise three p-n junctions 21. As discussed previously, the laser device 1 may comprise any number of semiconductor devices having a p-n type structure (as defined earlier) and may be devices integrated on a chip or connected in a circuit. For example, the junctions 21 may be lasers or light emitting diodes (LEDs) capable of efficiently converting an electrical current into photons. Furthermore, although three junctions 21 are shown, in practice the device may comprises a greater number of junctions 21 connected in series, in parallel or in series parallel, giving a total impedance of 50 Ω.

The input circuit 19 also comprises a voltage source 22 for forward biasing the p-n junctions 21. The output circuit 20 comprises a p-n junction 23, reverse biased by means of a voltage source 24, which therefore acts as a photodiode for converting incident radiation into an electrical current. For example, the collector 23 may be a silicon photodiode detector. The output circuit 20 has an output load resistance 25 ($R_L$) which may be relatively large (e.g. 50 Ω).

Figure 6B:
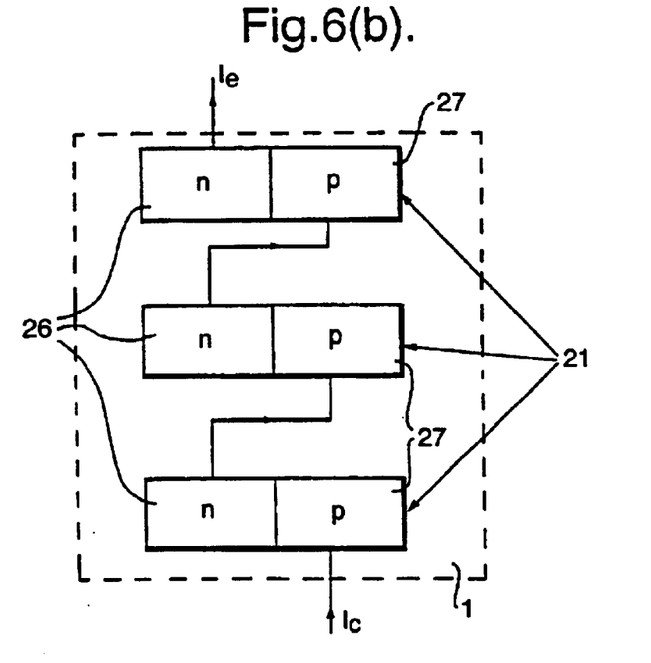

An enlarged view of a series of three p-n junctions 21 is shown in FIG. 6(b). In this embodiment, each junction 2 comprises an n-type region 26 and a p-type region 17, wherein the p-type region 27 of one junction is in connection with the n-type region 26 of the adjacent p-n junction such that the junctions are connected in series, in parallel or in series parallel.

The emitter current, $I_e$, i.e. the current flowing in the input circuit 19, passes through the p-n junctions 21 each of which converts the input electrical current into photons 29. These photons 29 are transmitted to the output circuit 20 and are collected by the photodiode 23 (or photodiodes) which converts the photons back to an equivalent electrical current, $I_C$. Although only one photodiode detector 23 is shown in this example, in practice this may be a number of photodiode detectors connected in series, in parallel or in series parallel. For example, it may be preferable have one photodiode detector for each of the p-n junctions 21 of the laser device 1. An OCT comprising a plurality of photodiode detectors may be capable of operating at higher speeds than an OCT comprising a single, large photodiode device.

If the optical conversion and transfer functions OCT are efficient, the device is capable of delivering current gain. The incremental current transfer efficiency, $\eta_{CT}$, for a single p-n junction may be defined by;

$$\eta_{CT}=\eta_{LD}\cdot\eta_{OP}\cdot\eta_{PD}$$

where $\eta_{LD}$ is the external incremental quantum efficiency (in photons per electron) of the light emitting device 21, $\eta_{OP}$ is the optical transfer efficiency between the light emitting device 21 and the reverse biased p-i-n photodiode 23 and $\eta_{PD}$ is the conversion efficiency (in electrons per photon) of the photodiode 23. For example, if each p-n junction 21 has a quantum efficiency ($\eta_{LD}$) of, say, 50%, and the optical transfer efficiency and photodiode efficiency are both 100%, then the three-junction OCT device 18 generates an incremental output current, $\Delta I_C$, from the photodiode 23 of 3 $\eta_{CT}$ $\Delta I_e$, that is $\Delta I_C=1.5. \Delta I_e$, where $I_e$, is the current in the laser. Hence the current output from the OCT device is greater than the input current. For 'n' p-n junctions in the array the net current transfer efficiency is $$\eta_{CT}=n\cdot(\eta_{LD}\cdot\eta_{OP}\cdot\eta_{PD})$$

Figure 7:
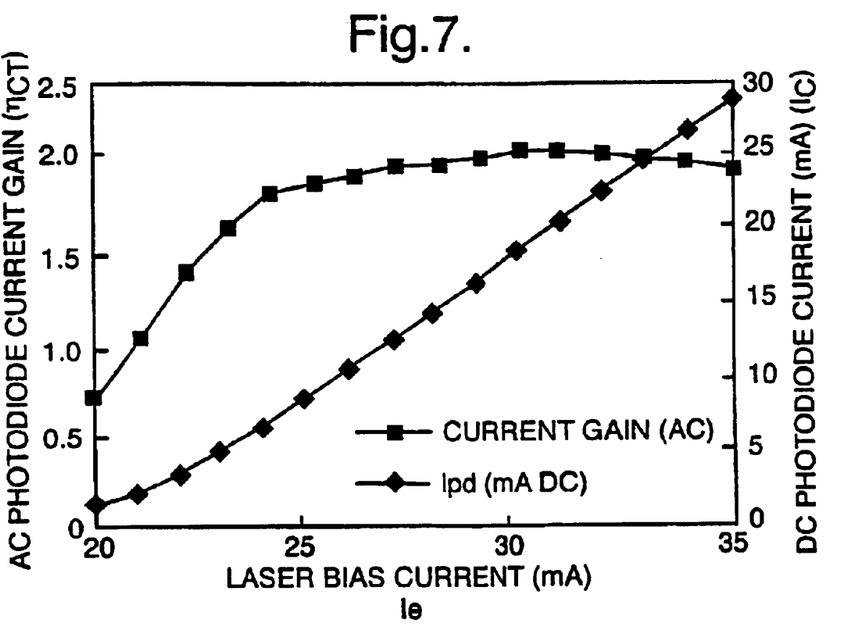
FIG. 7 shows the current transfer results of an optically coupled transistor comprising a ten-element laser device.

The current transfer results obtained for a OCT device, comprising an array of ten laser elements in series, are shown in FIG. 7 which shows the relationship between (i) AC photodiode current gain and (ii) DC photodiode current as a function of the laser bias current. To obtain these results, the ten element laser array was fed from a 50 Ω source and the photodiode had a 50 Ω load resistance, $R_L$.

The threshold current of the array was similar to that of the individual laser elements (~21 mA). Referring to FIG. 7 for an input current increment $\Delta I_e$ of, say, 14 mA above threshold, the incremental output photodiode current $\Delta I_C$ is around 28 mA, giving an (incremental) current gain of a factor of two. The incremental gain is a key parameter of the DC and RF performance of the OCT device and also fibre optic links which incorporate the device.

Figure 8:
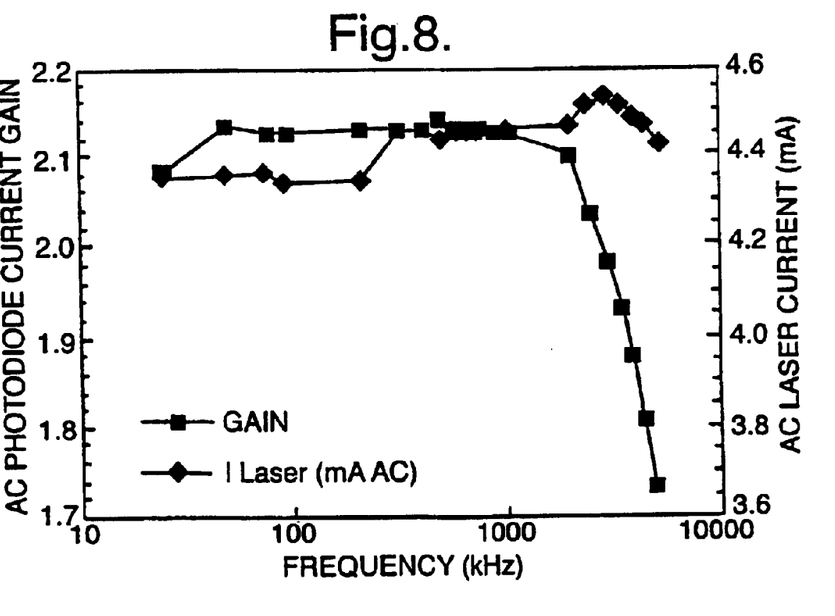
FIG. 8 shows the frequency response of the optically coupled transistor comprising a ten-element laser device and FIG. 9 shows a diagram of an optical repeater comprising the light emitting device shown in FIG. 1.

The frequency response of the OCT device comprising a ten-element laser array in electrical series is shown in FIG. 8 which shows (i) the AC photodiode current gain and (ii) the AC laser current gain over a frequency range of 25 kHz to 5 MHz. The gain is seen to reduce at approximately 3 MHz. This is consistent with the response speed limit of the silicon photodiode used in the OCT device. This gain reduction is, however, an artefact of the measurement and the response speed limit of the OCT may be increased by using a faster photodiode device.

The primary advantage of the OCT device is its ability to deliver current gain (as well as power gain). Furthermore, this may be achieved across a broad frequency band in a fixed impedance circuit. The impedance matching is achieved from DC to the operating limit of the laser.

Another advantage of the device is that the transit between the input circuit 8 and the output circuit 9 is optical rather than electrical and hence there are no displacement currents produced. Furthermore, as the input circuit 19 and the output circuit 20 are decoupled, this avoids any feedback from the output circuit 20 to the input circuit 19 which is a problem in conventional electronic transistors.

A further advantage of decoupling the input and output circuits 19,20 is that the transistor is then two physically separated and electrically independent two-terminal circuits, unlike the conventional transistor (FIG. 1) which is a three terminal device. Each of the two-terminal circuits therefore has more design degrees of freedom. The circuits 19,20 may therefore be more easily be distributed to alter the impedance of the input circuit 19 and the output circuit 20 using series or parallel circuit configurations with current combining and splitting being achieved in the optical domain, hence having no electrical penalty. The ability to distribute the transistor as two two-terminal circuits 19,20 also allows improved power outputs and thermal management.

In an uncoated device the optical coupling efficiency ($\eta_{OP}$) if less the 50% since only light from one end of the laser device 1 is collected by the photodiode in FIG. 6(a). In another embodiment of the OCT device 18 shown in FIG. 6(a), a highly reflective coating may be applied to one end of each p-n junction element 21, thus forcing all the output radiation to be emitted from the other end of the element This maximises the light received at the photodiode. Alternatively, two photodiodes may be included in the OCT, with one photodiode situated on each side of the laser device 1. The currents output from the photodiodes may then be combined in parallel to give twice the current achieved in a single-photodiode device.

In another embodiment of the OCT device 18 the p-n junctions could be series connected vertical cavity surface emitting lasers grown on top of collector photodiodes in parallel connection with their optical outputs being transmitted through a transparent "base" contact layer.

In order to achieve a greater current gain than is possible with a single OCT, a number of OCTs may be connected in series, in parallel or in series parallel (i.e. cascaded).

As the input and output circuits 19,20 are decoupled, the OCT device has useful application in the field of fibre optic links. For example, the optical transit between the input circuit 19 and the output circuit 20 may be achieved over a large distance, up to say 100 km. Thus, simple optical fibre links with broadband characteristics having reduced insertion loss, and possibly gain, may be realised by deploying the input and output circuits 19,20 of the transistor at either end of the optical fibre link.

This may be of particular advantage in the field of fibre optic links where signal insertion losses into fibre may be reduced. Furthermore, the individual elements in the laser device may be coherently locked such that coherent summation into a single passive waveguide output is obtained for input to a single optical fibre. This is more convenient than having to use a ribbon of optical fibres.

The laser device may also be used in the division of an RF signal through many fibre optic channels. Conventionally, this may done by splitting the optical signal between each channel and then amplifying each of the split signals (optical or RF amplification) to recover the original signal power. Alternatively, this may be done by splitting the amplified RF signal and transmitting each split signal to a separate channel each having its own light source. However, with the laser device 1 each laser element can provide sufficient power, without the need for amplification, to a separate optical fibre connected to each element in the array. This avoids any penalty in the signal division.

Figure 9:
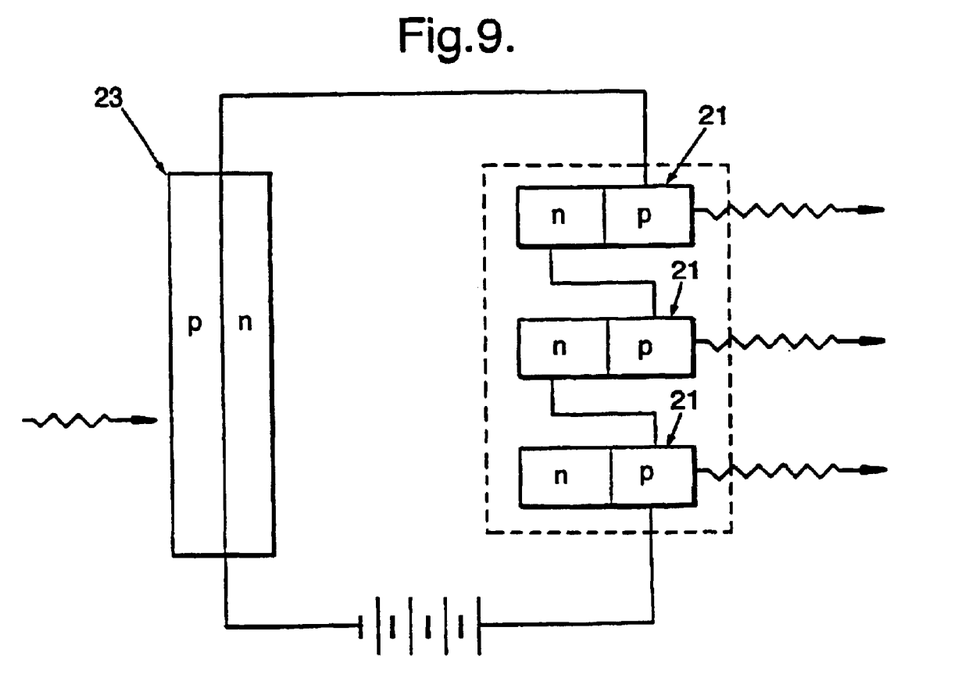

The OCT has so far been described as a device for converting an input electrical signal into an optical signal and then outputting an output electrical signal. An alternative configuration for the OCT is as an optical repeater, in which an input optical signal is converted into an electrical signal which is then converted back into one or more optical output signals. One possible configuration of the optical repeater is shown in FIG. 9. In practice, it may be preferable to include an amplifier and biasing network in the laser input circuitry to allow for the inefficiencies that arise in the optical conversion processes. The details of a suitable biasing network would be conventional to one familiar with the art.

What is claimed is:

1. A light emitting device, having an input impedance and a device quantum efficiency, for generating at least two beams of output radiation from an input current of electrons comprising;

at least two light emitting means for converting the input current of electrons into a beam of output radiation, each of the light emitting means having a respective optical waveguide and having an impedance and an individual quantum efficiency, wherein the light emitting means (i) are electrically connected in series such that the input impedance of the light emitting device is substantially equal to the sum of the impedances of the light emitting means and such that the quantum efficiency of the device is substantially equal to the sum of the quantum efficiencies of the light emitting means and (ii) are arranged optically such that the light emitting means do not share a common optical waveguide.

2. The light emitting device of claim 1, wherein the light emitting means are electrically connected such that the input impedance of the light emitting device is substantially equal to 50 Ω without additional circuitry or impedance matching elements.

3. The light emitting device of claim 2, wherein each of the light emitting means have a modulation frequency limit and wherein the input impedance of the light emitting device is substantially equal to 50 Ω across a frequency range substantially from DC to the modulation frequency limit of each of the light emitting means.

4. The light emitting devices of claim 1 wherein the light emitting means are p-n junctions.

5. The light emitting device of claim 4, wherein the p-n junctions are laser diodes or light emitting diodes.

6. The light emitting device 5, wherein the laser diode devices may be any one of AlGaAs, AlGaInP, AlGaInAs or AlGaInAsP laser diode devices.

7. The light emitting device of claim 5, wherein the p-n junctions each have an end face coated with a reflective coating.

8. An optically coupled transistor for generating an output electrical signal comprising;

the light emitting device of claim 1 for emitting at least two beams of output radiation and at least one photodetector for detecting the beams of radiation output from the light emitting device and for converting the beams of output radiation into an output electrical currents, wherein the light emitting device and the at least one photodetector are arranged such that there is no electrical feedback from the at least one photodetector to the light emitting device.

9. The optically coupled transistor of claim 8 wherein the one or more photodetector is a photodiode device.

10. The optically coupled transistor of claim 8, comprising at least two photodetectors, wherein the photodetectors are connected in any one of a series connection, a parallel connection or a series parallel connection.

11. The optically coupled transistor of claim 8, comprising one or more optical fibres for transmitting the beams of output radiation to the one or more photodetectors.

12. A fibre optic link comprising one or more optical fibres having an input endface and an output endface, and also comprising the light emitting device of claim 1, wherein the light emitting device his situated at the input endface of one or more optical fibres such that the beams of radiation output from the light emitting device are input to the one or more optical fibres.

13. A method for distributing an input signal into an output channel comprising the steps of;
   (i) outputting two or more beams of radiation from the light emitting device of claim 1 comprising at least two light emitting means and
   (ii) inputting the two or more beams of output radiation into the output channel,
   whereby the light emitting means are connected such that the device quantum efficiency is greater than or equal to the individual quantum efficiency of one of the light emitting means.

14. A method for distributing an input signal into a plurality of output channels comprising the steps of;
   (i) outputting two or more beams of radiation from the light emitting device claim 1 comprising at least two light emitting means and
   (ii) inputting each of the two or more beams of output radiation into a different one of the output channels,
   whereby the light emitting means are connected such that the device quantum efficiency is greater than or equal to the individual quantum efficiency of one of the light emitting means.

15. An optical repeater for receiving an optical input signal and generating one or more optical output signals comprising;
   a photodetector for receiving the optical input signal and converting the optical input signal into an electrical signal and
   the light emitting device of claim 1 for receiving the said electrical signal and outputting one or more optical signals.

16. The optical repeater of claim 15 and also comprising amplification means for amplifying the electrical signal output from the photodetector.

17. A light emitting device, having an input impedance and a device quantum efficiency, for generating at least two beams of output radiation from an input current of electrons comprising:
   at least two light emitting apparatuses, each light emitting apparatus comprising at least one light emitting means for converting the input current of electrons into a beam of output radiation, each light emitting means having a respective optical waveguide and having an impedance and an individual quantum efficiency, and at least one of said at least two light emitting apparatuses comprises at least two light emitting means electrically connected in parallel;
   wherein the at least two light emitting apparatuses are electrically connected in series such that the input impedance of the light emitting device is substantially equal to the sum of the impedances of the at least two light emitting apparatuses and the quantum efficiency of the device is substantially equal to the sum of the quantum efficiencies of the light emitting means and
   wherein the at least two light emitting apparatuses are arranged optically such that the light from one of the light emitting means is not transmitted to another of the light emitting means.

* * * * *